United States Patent [19]

Sander et al.

[11] 4,250,247

[45] Feb. 10, 1981

[54] ACID DEGRADABLE RADIATION-SENSITIVE MIXTURE

[75] Inventors: Jürgen Sander, Kelkheim; Gerhard Buhr, Königstein; Hans Ruckert, Wiesbaden, all of Fed. Rep. of Germany

[73] Assignee: Hoechst Aktiengesellschaft, Fed. Rep. of Germany

[21] Appl. No.: 54,809

[22] Filed: Jul. 5, 1979

[30] Foreign Application Priority Data

Jul. 5, 1978 [DE] Fed. Rep. of Germany ....... 2829512

[51] Int. Cl.$^3$ .................................................. G03C 1/68
[52] U.S. Cl. ................. 430/270; 204/158 R; 430/275; 430/306; 430/329
[58] Field of Search ............... 430/270, 329, 275, 306; 204/158 R

[56] References Cited

U.S. PATENT DOCUMENTS

| | | | |
|---|---|---|---|
| 2,892,712 | 6/1959 | Plambeck | 96/35 |
| 3,779,778 | 12/1973 | Smith et al. | 96/115 R |
| 3,915,704 | 10/1975 | Limburg et al. | 430/270 |
| 3,915,706 | 10/1975 | Limburg et al. | 430/270 |
| 3,917,483 | 11/1975 | Limburg et al. | 430/270 |
| 3,932,514 | 1/1976 | Thelem et al. | 252/406 PT |

*Primary Examiner*—Jack P. Brammer
*Attorney, Agent, or Firm*—James E. Bryan

[57] ABSTRACT

This invention relates to an improvement in a radiation-sensitive mixture containing (a) a compound which forms an acid under the influence of actinic radiation and (b) a compound which has at least one acid-cleavable bond and the solubility of which in a liquid developer is increased by the action of an acid, the improvement that the compound which is capable of being cleft by an acid contains at least one N-acyliminocarbonate group as the acid-cleavable group. The invention also relates to a process for producing relief images using the radiation-sensitive mixture.

7 Claims, No Drawings

ACID DEGRADABLE RADIATION-SENSITIVE MIXTURE

This invention relates to a novel radiation-sensitive mixture which contains as substantial constituents (a) a compound forming an acid under the influence of actinic radiation and (b) a compound having at least one bond which is capable of being cleft by an acid.

Positive-working light-sensitive copying materials are known, i.e. materials the copying layers of which become soluble in the exposed areas. The positive-working copying materials based on o-quinone diazides have, above all, gained acceptance in practice.

The light-sensitivity of these copying materials is often not satisfactory. To enhance the light-sensitivity, catalytically active light-sensitive systems may be employed, because, then, the quantum efficiency will become greater than 1.0. Recently, the well-known principle of starting subsidiary reactions by photolytically produced acids and thereby rendering soluble the exposed areas has been put to use in positive-working systems. In this process, photochemically produced strong acids serve to split special low and high-molecular weight acetals and O,N-acetals containing aromatic compounds as hydroxyl or amine components (U.S. Pat. No. 3,779,778) and orthoesters and amideacetals (German Offenlegungsschrift No. 2,610,842).

Combinations of photochemical acid formers with particular polyaldehydes and polyketones also have been described as positive-working copying compositions which produce visible images upon exposure (U.S. Pat. Nos. 3,915,704, 3,915,706, 3,917,483, 3,923,514, and 2,892,712).

These mixtures of substances are, however, not without disadvantages. The properties of polyaldehydes and polyketones which, as the essential constituents, determine the quality of the corresponding recording materials can to only a limited extent be varied and adapted to practical requirements.

In spite of their catalytical mode of acting, the mixtures containing the above-mentioned acetals and O,N-acetals do not have a satisfactory practical light-sensitivity. In addition, many of the acetals, O,N-acetals and orthoesters mentioned are not easily obtainable.

It is an object of the invention to provide a novel positive-working radiation-sensitive mixture which is highly sensitive to actinic radiation, in particular to short-wave light and electronic radiation, and the constituents of which may be easily obtained.

The invention is based on a radiation-sensitive mixture which contains (a) a compound forming an acid under the influence of actinic radiation and (b) a compound which has at least one acid-cleavable bond and the solubility of which in a liquid developer is increased by the action of an acid.

The mixture of the invention has the feature that the compound which is capable of being cleft by an acid contains as the acid-cleavable group at least one N-acyliminocarbonate group.

In the present description, actinic radiation is to be understood as meaning any radiation having an energy which corresponds at least to the energy of short-wave visible light. Long-wave UV radiation is particularly suitable, and also electronic and laser radiation.

Suitable liquid developers are, in particular, aqueous solutions, preferably weakly alkaline solutions, and also organic solvents which may be mixed with water or aqueous solutions.

The preferred compounds which are capable of being cleft by an acid and contain at least one N-acyliminocarbonate group are those which correspond to the general formula I:

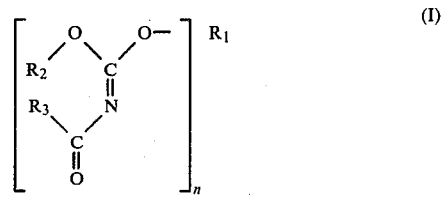

where
- $R_1$ is an n-valent aliphatic, cycloaliphatic or aromatic group,
- $R_2$ and $R_3$ are alkyl or aryl groups, and any two of the groups $R_1$, $R_2$ and $R_3$ may be linked to form a heterocyclic ring, and
- n is an integer from 1 to 3, preferably 1 or 2.

By n-valent aromatic groups $R_1$, preferably mononuclear or polynuclear aromatic or heteroaromatic groups are to be understood, which may be substituted by alkyl, aryl, alkoxy, aryloxy, acyl, acyloxy, alkylmercapto, aminoacyl, acylamino, carbalkoxy, hydroxy, nitro, sulfonyl or cyano groups or by halogen atoms and which preferably contain from 4 to 20 carbon atoms.

Suitable n-valent aliphatic or cycloaliphatic groups $R_1$ are branched and unbranched, saturated and unsaturated, cyclic and open-chain groups, which may be substituted by possibly substituted aryl groups, halogen atoms, cyano, ester, aryloxy, or alkoxy groups and may contain ether or keto groups.

If $R_1$ is an acyclic group it contains generally from 2 to 20, preferably 2 to 10 carbon atoms. $R_1$ is preferably a cyclic, particularly an aromatic group, in particular if n=1.

If $R_2$ and $R_3$ are alkyl groups, they may be saturated or unsaturated, open-chain or cyclic and may be substituted by halogen atoms, cyano, ester, hydroxy, alkoxy, aryloxy or aryl groups. As alkyl groups $R_2$ and $R_3$ usually have from 1 to 20, preferably from 1 to 8 carbon atoms.

In case $R_2$ and $R_3$ are present as individual substituents they are preferably aromatic groups which may be substituted and contain from 6 to 15, particularly from 6 to 12 carbon atoms.

If two of the groups $R_1$, $R_2$ and $R_3$ together form a heterocyclic ring, this ring normally may have from 5 to 8, preferably 5 or 6 ring members. Preferred are compounds of this type in which this ring is, by annellation, linked with a cycloaliphatic or, preferably, an aromatic ring. The ring system may be substituted by groups of the above-specified kind. It generally may contain from 3 to 20, preferably from 5 to 15 carbon atoms.

In addition to the specified substituents another grouping of the formula I may be present as a substituent in one of the groups $R_2$ and $R_3$.

A particular group of compounds having the general formula I in which n=1 may be obtained according to the process described in "Zhurnal Organicheskoi Khimii", 3, 480 (1967), by reacting the easily obtainable acylisocyanide dichlorides $R_3CON=CCl_2$, as specified, for example, in German Offenlegungsschrift No. 1,545,802, with monovalent or polyvalent aromatic or heteroaromatic hydroxy compounds.

In that case, $R_1$ and $R_2$ are monovalent or divalent aromatic groups or they are linked to form a ring which may be substituted; $R_3$ is an alkyl or aryl group.

If particular, at least divalent aromatic hydroxy compounds of those listed below are used, it is also possible to obtain polymeric compounds containing more than three N-acyliminocarbonate units in their molecules.

Suitable acylisocyanide dihalides are, for example, the acetyl, chloroacetyl, dichloroacetyl, trichloroacetyl, fluoroacetyl, diphenylacetyl, propionyl, isobutyl, capryl, lauryl, stearyl, benzoyl, 4-chloro-benzoyl, 4-fluoro-benzoyl, 3-ethoxy-4-nitrobenzoyl, 4-methylbenzoyl, naphthoyl, 2-furoyl and 2-thienyl isocyanide dihalides.

Suitable representatives of the aromatic hydroxy compounds are: phenol, 3,5-dimethyl-phenol, p-cyclohexyl-phenol, 4-(2-phenyl-prop-2-yl)-phenol, p-(2,4-dichloro-phenoxy)-phenol, resorcinol-monomethylether, 5-chloro-2-hydroxy-benzoic acid isoamylester, p-chlorophenol, 5,6,7,8-tetrahydro-1-naphthol, 2,4-dinitro-phenol, 2 or 3 or 4-hydroxy-benzophenone, 4-hydroxybenzoic acid methylphenylamide, hydroquinone monobenzylether, p-hydroxy-desoxybenzoin, 3 or 4-hydroxy-diphenylmethane, 3-bromo-4'-hydroxy-benzophenone, brenzcatechin, 4-t-butyl-brenzcatechin, 4,6-di-t-butyl-brenzcatechin, 4-chloroacetyl-brenzcatechin, 1 and 2 naphthol and 1-bromo-2-hydroxy-napthalene, hydroquinone, 2-methoxy-hydroquinone, 4,4'-dihydroxy-diphenylether, 4,4'-dihydroxy-diphenylsulfone, 4,4'-dihydroxy-diphenylsulfide, 2,4 and 4,4'-dihydroxy-benzophenone, bisphenol A, 2,4-dihydroxyacetophenone, 3,4-dihydroxy-diphenyl, resorcinol, 4-n-hexyl-resorcinol, 3,5-dihydroxy-benzoic acid isoamylester, the methyl, ethyl, isopropyl, butyl and isoamylester of 2,4-dihydroxy-benzoic acid, 4-acetyl, 4-propionyl, 4-valeryl, 4-benzoyl, 4-benzyl, 4-cyano, 4-chloro and 4-nitro resorcinol, phloroglucinol, 1,2,4-trihydroxy-benzene, 2,4, 2,5 and 2,7-dihydroxy-naphthalene.

Another special group of compounds of the general formula I are compounds which have the general formula II:

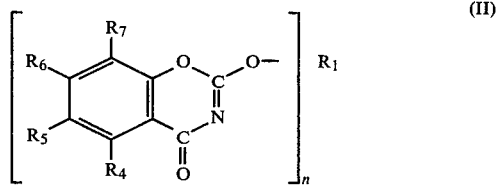

(II)

In this formula, n and $R_1$ have the above-specified meaning. $R_4$, $R_5$, $R_6$ and $R_7$ are hydrogen atoms or halogen atoms, aryl, aryloxy, alkyl, alkoxy, cyano, acyl, acyloxy, carbalkoxy groups or nitro groups, and any two of the groups $R_4$, $R_5$, $R_6$ and $R_7$ may be linked to form a preferably aromatic ring which may be substituted.

The compounds containing units of the general formula II may be easily prepared by reacting aromatic or heteroaromatic or aliphatic hydroxy compounds $R_1$ $(OH)_n$ with the 2-chloro-4H-1,3-benzoxazine-4-ones described in German Offenlegungsschrift No. 1,545,802:

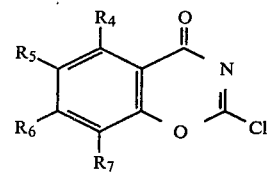

In this formula, n, $R_1$ and $R_4$ to $R_7$ have the above-specified meaning.

In the present description, aliphatic alcohols $R_1$ $(OH)_n$ are to be understood as meaning monovalent or polyvalent alcohols, the alcoholic OH groups of which are all grouped at different, saturated aliphatic or cycloaliphatic carbon atoms.

The following are examples of 2-chloro-4H-1,3-benzoxazine-4-ones: 2-chloro-4H-1,3-benzoxazine-4-one, 6-chloro, 6-methyl, 6-nitro, 6-chloro-8-methyl, 6-methoxy, 8-methyl and 6-chloro-8-nitro-2-chloro-4H-1,3-benzoxazine-4-one, 2-chloro-4H-1,3-naphthoxazine-4-one, and hexahydro-2-chloro-4H-1,3-benzoxazine-4-one.

In addition to the aromatic hydroxy compounds which have already been named in connection with Formula I, the below-listed aliphatic alcohols are, for example, also suitable:

Benzyl alcohol, ethylene glycol monobutylether, diethylene glycol monohexylether, triethylene glycol monobutylether, octanol, ethylene glycol monophenylether, decyl alcohol and dodecyl alcohol, ethane-1,2, propane-1,3 and butane-1,4 diols which may be substituted, pentane-1,5-diol, n-hexane-1,6-diol, 2-ethyl-hexane-1,6-diol, cyclohexane-1,4-diol, nonane-1,7-diol, nonane-1,9-diol, decane-1,10-diol, dodecane-1,12-diol, 1,4-bis-(hydroxymethyl)-cyclohexane, thiodipropylene glycol, dibutylene glycol, 4,8-bis-(hydroxymethyl)-tricyclodecane, n-butene-(2)-1,4-diol, p-xylylene glycol, di, tri, tetra, penta and hexaethylene glycol, di and tripropylene glycol and polyethylene glycols having average molecular weights of 200, 300, 400 and 600, glycerol, 1,2,6-hexane-triol, trimethylolpropane, and 1,4,7-trihydroxy-heptane.

Another particular group of compounds of the general formula I are compounds which have the general formula III:

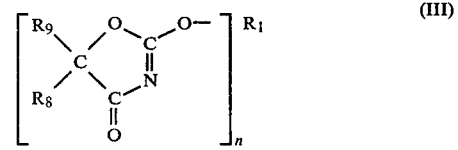

(III)

In this formula, n has the above-specified meaning.
$R_1$ is a n-valent aromatic group which may be substituted, and $R_8$ and $R_9$ are hydrogen atoms or alkyl groups.

The compounds of the general formula III can easily be prepared as follows: In the 2-mercapto-1,3-oxazoline-4-ones

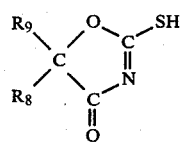

described in J. Chemical Society (London) (1950), 30, the mercapto group is first exchanged for chlorine by chlorination, and then chlorine is replaced by aryloxy groups, by reaction with aromatic hydroxy compounds $R_1(OH)_n$. n, $R_1$, $R_8$ and $R_9$ have the meanings given under formula III.

The preferred 2-mercapto-1,3-oxazoline-4-ones are, for example, 5-methyl, 5,5-dimethyl, 5-methyl-5-ethyl and 5,5-diethyl-2-mercapto-1,3-oxazoline-4-one, in addition to 2-mercapto-1,3-oxazoline-4-one.

As aromatic hydroxy compounds, the aromatic hydroxy compounds mentioned under formula I are used.

The above-described preferred compounds of the general formula I can be prepared without difficulty according to the specified processes by successively reacting easily obtainable acid chlorides or salicyclic acid chlorides or cyanohydrins with potassium thiocyanate, chlorine and hydroxy compounds.

Another simple process for preparing compounds of the general formulae I and II consists in the successive reaction of salicyclic acid esters or salicyclic acid chlorides with cyanic acid esters and hydroxy compounds.

By using different N-acyliminocarbonates or mixtures thereof the material properties of the recording materials prepared therewith may be varied within a wide range.

The N-acyliminocarbonates according to the invention are extremely sensitive to acids. Cyclic N-acyliminocarbonates which contain at least one aromatic ring have proved to be the most stable representatives.

To prepare the positive-working radiation-sensitive mixtures of the invention, the above-described N-acyliminocarbonates are mixed with substances which form acids, photochemically and/or by the action of high energy rays. The proportion of the N-acyliminocarbonates in the non-volatile constituents of the entire mixture may range between about 9 and 70% by weight, preferably between 14 and 45% by weight.

In addition, the mixtures preferably contain a polymeric, particularly water-insoluble binder which is soluble in organic solvents. As developing liquids for the exposed copying layers, aqueous alkaline solutions advantageously may be used, and they are usually preferred to developers based on organic solvents; therefore, the preferred binders are especially those which are soluble or at least swellable in aqueous alkaline solutions.

The phenolic resins, in particular the novolaks, which have been successfully used in many positive-working copying materials also have proved to be especially useful and advantageous in the mixtures according to the invention. They promote the strong differentiation between the exposed and unexposed layer areas upon development, particularly the more highly condensed resins containing substituted phenols, e.g. cresols, as condensation partners of formaldehyde. The novolaks also may be modified in known manner, by reacting part of their hydroxy groups, for example, with chloroacetic acid, isocyanates, epoxides or carboxylic acid anhydrides. Other alkali-soluble resins, for example, copolymers of maleic anhydride and styrene, vinyl acetate and crotonic acid, methylmethacrylate and methacrylic acid and the like, are also suitable as binders. The type and quantity of the alkali-soluble resins may vary according to the intended use. The preferred proportions relative to the total solids content range between 30 and 90% by weight, particularly preferred between 55 and 85% by weight. In addition, a large number of other resins may be used as well; preferred are vinyl polymers, such as polyvinyl acetates, polyacrylates, polyvinyl ethers and polyvinyl pyrrolidones which, in turn, may be modified by comonomers. The most favorable proportions of these resins depend upon the technical requirements and upon their influence on the developing conditions and, generally, they do not exceed 20% by weight of the alkali-soluble resin. To meet special requirements regarding, for example, flexibility, adhesion, gloss, etc., the light-sensitive layer additionally may contain small quantities of other substances, for example, polyglycols, cellulose derivatives, such as ethyl cellulose, wetting agents, dyes and finely divided pigments.

A large number of known compounds and mixtures are suitable as radiation-sensitive components which form or split-off acids upon radiation; among these number, for example, diazonium, phosphonium, sulfonium and iodonium salts, halogen compounds, quinone diazide sulfochlorides and organometal-organohalogen combinations.

Suitable diazonium salts are the compounds known in diazo printing which have a utilizable absorption between 300 and 600 nm. Some proven diazonium compounds which have a sufficient storability, as is known from experience, are given in the examples; compounds which do not contain any basic substituents are preferred.

The diazonium, phosphonium, sulfonium and iodonium compounds mentioned are, as a rule, employed in the form of their salts which are soluble in organic solvents, in most cases as separation products with complex acids, such as hydrofluoboric acid, hexafluorophosphoric acid, hexafluoroantimonic acid and hexafluoroarsenic acid.

It is, however, also possible to use derivatives of the positive-working o-quinone diazides. The acidity of the indene carboxylic acids formed when exposing o-naphthoquinone diazides is, in most cases, just sufficient only for an adequate imagewise differentiation. From this group, the naphthoquinone-1,2-diazide-4-sulfochloride is preferred, during the exposure of which three acid functions are formed, so that a relatively high amplification factor is produced upon cleavage of the N-acyliminocarbonates.

In principle, any organic halogen compounds which are also known as photochemical free-radical initiators, for example, compounds having more than one halogen atom on one carbon atom or on one aromatic ring, may be used as halogen-containing radiation-sensitive compounds which form halogen hydracid. Examples thereof are described in U.S. Pat. Nos. 3,515,552, 3,536,489 and 3,779,778 and in German Offenlegungsschrift No. 2,243,621. Also in the case of the positive-working copying layers of the invention, the action of these halogen-containing compounds may be spectrally influenced and enhanced by known sensitizers.

Also suitable are particular substituted trichloromethyl pyrones, such as those described in German Offenlegungsschrift No. 2,610,842. The 2-aryl-4,6-bis-trichloromethyl-s-triazines described in the previous German patent application No. P 27 18 259 are particularly suitable.

Examples of suitable initiators are: 4-(di-n-propylamino)benzene diazonium tetrafluoroborate, 4-p-tolylmercapto-2,5-diethoxy-benzene diazonium hexafluorophosphate and diazonium tetrafluoroborate, diphenylamine-4-diazonium sulfate, 4-methyl-6-trichloromethyl-2-pyrone, 4-(3,4,5-trimethoxy-styryl)-6-trichloromethyl-2-pyrone, 4-(4-methoxy-styryl)-6-(3,3,3-trichloropropenyl)-2-pyrone, 2-trichloromethyl-benzimidazole, 2-tribromomethylquinoline, 2,4-dimethyl-1-tribromoacetyl-benzene, 3-nitro-1-tribromo-acetyl-benzene, 4-dibromoacetyl-benzoic acid, 1,4-bisdibromo-methyl-benzene, tris-dibromomethyl-s-triazine, 2-(6-methoxy-naphth-2-yl)-, 2-(naphth-1-yl)-, 2-(naphth-2-yl), 2-(4-ethoxy-ethyl-naphth-1-yl)-, 2-(benzopyran-3-yl)-, 2-(4-methoxy-anthrac-1-yl)-, 2-(phenanthr-9-yl)-4,6-bis-trichloromethyl-s-triazine and the compounds mentioned in the examples.

The amount of initiator used also may vary widely depending upon its chemical nature and upon the composition of the mixture. Favorable results are obtained, if about 0.1 to 10% by weight relative to the total solids content are employed, 0.2 to 5% being preferred. For copying layers having thicknesses exceeding 10 μm, it is, in particular, advisable to use relatively small amounts of acid donors.

In addition, soluble or finely divided dispersible dyes and, depending upon the purpose for which it is intended, UV absorbers may be added to the light-sensitive mixture. The most favorable quantitative relationships between the components may be easily determined in each individual case with the aid of preliminary tests.

Suitable solvents for the mixture of the invention are ketones, e.g. methylethyl ketone; chlorinated hydrocarbons, e.g. trichloroethylene and 1,1,1-trichloroethane; alcohols, e.g. n-propanol; ethers, e.g. tetrahydrofuran; alcohol ethers, e.g. ethylene glycol monoethyl ether; and esters, e.g. butyl acetate. Mixtures which, for special purposes, additionally may contain solvents, for example, acetonitrile, dioxane or dimethyl formamide, also may be employed. Basically, any solvents may be used which do not irreversibly react with the components of the layer.

The intended coating process, the thickness of the layer and the drying apparatus employed must, however, be taken into account when choosing the solvents. Thin layers of up to about 5 μm in experimental amounts are preferably applied on a whirler coater by pouring on the solution. By one application according to this procedure, or by means of a doctor blade, layer thicknesses exceeding 60 μm may be obtained, if solutions having solids contents of up to about 40% are used. If the coating is to be applied to both sides of the support, dip-coating is preferred; in that case, the use of low-boiling solvents will yield the advantage of a fast-drying coating. Webs are coated by means of rollers, slot dies or by spraying. Individual plates, for example, zinc and multimetal plates may be coated with the aid of a curtain coater.

As compared with other positive-working layers, in particular the layers based on o-naphthoquinone diazide, thicker layers advantageously may be prepared using the light-sensitive mixture of the invention, because the light-sensitivity of this mixture is only to a relatively small extent dependent upon the thickness of the layer. It is possible to expose and process layers having thicknesses of up to about and even exceeding 100 μm.

Preferred supports for thick layers exceeding 10 μm are plastic films which, then, serve as temporary supports for transfer layers. For that purpose and for color films, polyester films, for example, made of polyethylene terephthalate, are preferred. Polyolefin films, e.g., of polypropylene, are, however, also suitable. The supports for layers having thicknesses below about 10 μm are usually metals. The following materials may be employed as supports for offset printing plates: mechanically or electrochemically roughened and, if required, anodized aluminum which may, additionally, have been subjected to a chemical pretreatment using, e.g., polyvinyl phosphonic acid, silicates or phosphates; also multimetal plates having Cu/Cr or brass/Cr as the uppermost layer. For the preparation of letterpress printing plates the layers of the invention may be applied to zinc or magnesium plates or the commercial microcrystalline alloys thereof for powderless etching processes; in addition, the layers may be applied to etchable plastic materials, for example, polyoxymethylene. Due to their good adhesion and resistance to etching on copper and nickel surfaces, the layers of the invention are suitable for the preparation of gravure printing or screen printing forms. The inventive mixtures also may be used as photoresists in chemical milling.

Further, the coating may be applied directly or by layer transfer from a temporary support to materials for printed circuit boards comprising insulating plates which have a copper plating on one or both sides; to glass or ceramic materials which may have been subjected to an adhesion-promoting pretreatment, and to silicon discs for which, in the field of microelectronics, experience has already been gained in electron-beam imaging. In addition, wood, textiles and the surfaces of many other materials may be coated, which are advantageously imaged by projection and are resistant to the action of alkaline developers.

For drying after coating, the conventional apparatuses and conditions may be adopted. The layers withstand temperatures up to about 100° C., and for short periods also up to 120° C., without any loss of radiation sensitivity.

The usual light sources may be employed for exposure, for example, tubular lamps, xenon pulse lamps, metal-halide high pressure mercury vapor lamps and carbon arc lamps. In addition, the light-sensitive N-acyliminocarbonate layers may be exposed in the conventional projectors and enlargers under the light of the metal filament lamps and by contact exposure with ordinary incandescent bulbs. The coherent light of a laser also may be used for exposure. For the purposes of the present invention, short-wave lasers of an adequate power are suitable, for example, argon lasers, krypton ion lasers, dyestuff lasers and helium-cadmium lasers emitting radiation between 300 and 600 nm. The laser beam is controlled by means of a predetermined programmed line and/or halftone screen pattern.

Another possibility of imaging consists in irradiating with electron beams. Electron beams can thoroughly disintegrate and cross-link the mixture of the invention as well as many other organic materials, so that a negative image is formed when the non-irradiated areas are removed by solvents or by exposing without an original and developing. In case of a lower intensity and/or higher writing speed of the electron beam, on the other hand, the electron beam causes a differentiation which results in an increased solubility, i.e. the irradiated layer areas may be removed by the developer. It has been found that the layers according to the invention have a considerably higher sensitivity to electron beam irradiation than conventional naphthoquinone diazide layers and—as explained in the examples—that a wide range of a comparatively low energy action from electron beams may be utilized. The most favorable conditions may be easily determined by preliminary tests.

The imagewise exposed or irradiated layer may be removed by practically the same developers which also are used for commercial naphthoquinone diazide layers and photoresist compositions; or the copying conditions for the novel layers advantageously may be adapted to the known auxiliaries, e.g., developers and programmed spray developing apparatuses. The aqueous developing solutions may, for example, contain alkali phosphates, alkali silicates or alkali hydroxides and, in addition, wetting agents and small amounts of organic solvents. In certain cases, solvent/water mixtures also may be used as developers. The most favorable developer may be determined by carrying out tests with the layer used in each particular case. If necessary, the developing process may be promoted by mechanical means. In order to increase the stability during printing and also the resistance to washing solutions, correcting agents and printing inks which are hardenable by UV light, the developed plates may, for a short period, be heated to elevated temperatures, as has been proposed for diazo layers in British Pat. No. 1,154,749.

According to the invention, a process is also provided for producing relief images, in which a radiation-sensitive recording material which comprises a support and a recording layer containing as substantial constituents (a) a compound forming an acid under the influence of actinic radiation and (b) a compound which has at least one acid-cleavable bond and the solubility of which in a liquid developer is increased by the action of an acid, is imagewise irradiated with actinic radiation of such a dosage that the solubility of the layer in a liquid developer is increased and the irradiated layer areas are then removed with the aid of a developer. The process has the feature that a compound (b) is used which contains as the acid-cleavable group at least one N-acyliminocarbonate group.

If electronic radiation is used to carry out the process, the known photolytic acid donors which are sensitive to long-wave ultraviolet and visible light are suitable and, in addition, also photolytic acid donors which have their absorption ranges in the shorter wave region of the electromagnetic spectrum and which are, thus, only slightly sensitive to daylight. This yields the advantage that the recording materials need not be handled in the absence of light and that the materials may be rendered storable in a better way.

Initiators of this kind are, for example, tribromomethylphenyl-sulfone, 2,2',4,4',6,6'-hexabromo-diphenylamine, pentabromoethane, 2,3,4,5-tetrachloroaniline, pentaerythritol-tetrabromide, ®Clophen resin W, i.e. a chlorinated terphenyl resin, or chlorinated paraffins.

Below, examples of the light-sensitive mixtures according to the invention are given. First, the preparation of a number of novel N-acyliminocarbonates is described, which have been tested as acid-degradable compounds in the mixtures according to the invention. They are consecutively numbered as compounds 1 to 30, and are also designated by these numbers in the examples of applications.

In the examples, parts by weight (p.b.w.) and parts by volume (p.b.v.) have the same relationship as the g to the ml. If not otherwise specified, percentages and quantitative relationships are to be understood as being given in units of weight.

GENERAL RULE A

Preparation of compounds 1 and 2 listed in Table 1

A solution composed of 1 mole of acylisocyanide dichloride, 2 moles of triethylamine or pyridine and 2 moles of a monovalent or 1 mole of a divalent hydroxy compound in an inert solvent is stirred for 1 to 20 hours at room temperature. The organic phase is washed in an alkaline solution. After drying, the solvent is removed. The remaining residue is purified according to known methods. The yields given are not optimized.

TABLE 1

| Compound No. | Compounds of the general formula I $n = 1; R_3 = $ phenyl | | | |
|---|---|---|---|---|
| | $R_1$ | $R_2$ | Flash Point (°C.) | Yield (% of theoretical) |
| 1 | 2-naphthyl | 2-naphthyl | 147–149 | 41 |
| 2 | phenylene-1,2 | | 112–114 | 23 |

GENERAL RULE B

Preparation of Compounds 3 to 30 listed in Tables 2 and 3

To a solution or suspension composed of n moles of 2-mercapto-4H-1,3-benzoxazine-4-one derivatives or 2-mercapto-1,3-oxazoline-4-one derivatives in an inert solvent, 2 n moles of chlorine are added at room temperature. The reaction takes place instantaneously with a temperature rise. After removal of the readily volatile components, 2-chloro-4H-1,3-benzoxazine-4-one derivatives or 2-chloro-1,3-oxazoline-4-one derivatives are obtained as oily or crystalline residues. The residues which are susceptible to moisture are generally not purified, and are immediately used for further reaction.

1 Mole of an n-valent hydroxy compound, n moles of triethylamine or pyridine and the above-obtained residue (n moles) are dissolved in an inert solvent and stirred for 1 to 20 hours at room temperature. The solution is washed in an alkaline solution. After drying, the solvent is removed. The remaining residue is purified according to known methods. The yields given are not optimized.

The compounds of the general formula II have in their IR spectra typical bands at about 1700 cm$^{-1}$ and at about 1560 cm$^{-1}$. Compounds containing units of the general formula III have characteristic IR bands at about 1760 cm$^{-1}$ and at about 1550 cm$^{-1}$.

TABLE 2

Compounds of the general formula II
$R_4 = H$

| Compound No. | n | $R_1$ | $R_5$ | $R_6$ | $R_7$ | Flash Point (°C.) | Yield (% of theoretical) |
|---|---|---|---|---|---|---|---|
| 3 | 1 | phenyl | H | H | H | 206–208 | 43 |
| 4 | 1 | 2-naphthyl | H | H | H | 191–192 | 41 |
| 5 | 1 | 2-naphthyl | methoxy | H | H | 236–238 | 22 |
| 6 | 2 | 4,4'-diphenylene sulfone | H | H | H | 149–150 | 45 |
| 7 | 1 | 4-(2-phenyl-prop-2-yl)phenyl | H | H | H | 135–137 | 37 |
| 8 | 2 | (—CH$_2$)$_2$—O—(CH$_2$—)$_2$ | H | H | H | oil | 66 |
| 9 | 1 | phenyl | methoxy | H | H | 250–252 | 28 |
| 10 | 1 | phenyl | chloro | H | H | 207–209 | 68 |
| 11 | 1 | 3-methoxy-phenyl | benzo | | H | 208–212 | 23 |
| 12 | 1 | 2-chloro-4-benzoyl-phenyl | H | H | methyl | 154–156 | 82 |
| 13 | 1 | 4-benzyloxy-phenyl | H | H | methyl | 147–149 | 84 |
| 14 | 1 | 4-phenylacetyl-phenyl | H | H | methyl | 165–167 | 27 |
| 15 | 2 | 1,4-cyclohexylene | H | H | methyl | 232–234 | 23 |
| 16 | 1 | 2-naphthyl | chloro | H | nitro | 267–270 | 64 |

TABLE 3

Compounds of the general formula III

| Compound No. | n | $R_1$ | $R_8$ | $R_9$ | Flash Point (°C.) | Yield (% of theoretical) |
|---|---|---|---|---|---|---|
| 17 | 1 | 4-(2-phenyl-prop-2-yl)phenyl | methyl | methyl | 98–99 | 43 |
| 18 | 1 | phenyl | methyl | methyl | oil | 47 |
| 19 | 1 | 2-naphthyl | methyl | methyl | 149–150 | 21 |
| 20 | 2 | 1,2-bis-(phenylene-(3)-oxy)-ethane | methyl | methyl | 188–191 | 66 |
| 21 | 2 | 2,2-bis-phenylene-(4)-propane | methyl | methyl | oil | 87 |
| 22 | 1 | 4-benzyloxy-phenyl | H | H | 165–167 | 29 |
| 23 | 2 | bis-phenylene-(4,4')-oxide | methyl | methyl | 179–181 | 63 |
| 24 | 1 | 4-(2,4-dichlorophen-oxy)-phenyl | methyl | methyl | 132–133 | 69 |
| 25 | 1 | 4-cyclohexyl-phenyl | methyl | methyl | 98–100 | 46 |
| 26 | 1 | 1-bromo-2-naphthyl | methyl | methyl | 175–177 | 18 |
| 27 | 1 | 4-chloro-2-isoamyl-oxycarbonyl-phenyl | methyl | methyl | oil | 36 |
| 28 | 1 | 5,6,7,8-tetrahydro-1-naphthyl | methyl | methyl | 154–156 | 55 |
| 29 | 2 | 1,4-phenylene | methyl | methyl | 222–225 | 32 |
| 30 | 2 | 2-methoxy-1,4-phenylene | methyl | methyl | 237–239 | 25 |

EXAMPLE 1

An offset printing form is prepared as follows:
A coating solution composed of
94.6 p.b.w. of methyl ethyl ketone,
4.0 p.b.w. of a cresol-formaldehyde novolak (melting range according to the capillary method DIN 53 181: 105° to 120° C.),
1.2 p.b.w. of compound 24,
0.2 p.b.w. of 2-(4-ethoxy-naphth-1-yl)-4,6-bis-trichloromethyl-s-triazine, and
0.01 p.b.w. of Crystal Violet
is applied to an electrolytically roughened and anodized aluminum foil on a whirler coater (150 rpm), so that a dry-layer weight of about 1.5 to 2.0 g/m² is obtained. The sufficiently dried light-sensitive material is exposed for 20 seconds under a positive line and halftone original using a 5 kW metal halide lamp disposed at a distance of 110 cm; upon exposure a strong blue-green image contrast is visible. The following developing solution is used for development:
5.5% of sodium metasilicate×5 H$_2$O,
3.4% of trisodium phosphate×12 H$_2$O,
0.4% of sodium dihydrogen phosphate, anhydrous, and
90.7% of completely desalinated water.

The exposed layer areas are removed within 40 seconds, and the blue-dyed unexposed layer areas remain as the printing stencil. The offset printing form prepared in this way is, as usual, inked with a greasy ink and clamped into a printing machine. For storing, the plate may be wiped over with commercial preserving agents. The printing test is interrupted after the production of 50,000 prints with the printing form still being intact. The long press run obtainable still may be markedly increased by post-heating the developed printing form to about 230° to 240° C.

EXAMPLE 2

Example 1 is repeated, but instead of compound 24 equal quantities by weight of compounds 19 or 14 are used. Exposure is carried out during 35 seconds under the conditions mentioned in Example 1, and for development the following developing solution is used:
0.6% of NaOH,
0.5% of sodium metasilicate×5 H$_2$O,
1.0% of n-butanol, and 97.9% of completely desalinated water.

Also in this case, a positive printing form is obtained which is capable of withstanding long press runs.

EXAMPLES 3 TO 6

About 2 μm thick layers composed of
74% of the novolak according to Example 1,
22% of an acyliminocarbonate,
3.8% of an acid donor, and
0.2% of a dyestuff
are applied to wire-brushed aluminum foils and irradiated with 11 kV electrons. In Example 6, in which a chlorine-substituted acyliminocarbonate is used without an additional acid donor, the percentage of novolak has been increased to 77.8%. The irradiated areas are washed away with the developer of Example 1 under the conditions specified in Table 4.

TABLE 4

| Example | Compound No. | Acid Donor | Irradiated Energy (Joule/cm$^2$) | Developing Time (seconds) |
|---|---|---|---|---|
| 3 | 17 | 4-(2,4-dimethoxy-styryl)-6-trichloro-methyl-2-pyrone | $1-10 \cdot 10^{-2}$ | 30 |
| 4 | 23 | 2-(4,7-dimethoxy-naphth-1-yl)-4,6-bis-trichloromethyl-s-triazine | $1-15 \cdot 10^{-2}$ | 15 |
| 5 | 23 | chlorinated paraffin resin | $3-40 \cdot 10^{-2}$ | 18 |
| 6 | 24 | none | $10-30 \cdot 10^{-2}$ | 10 |

The layers of Examples 5 and 6 are practically insensitive to the light of the lamps which are normally used in reproduction techniques.

EXAMPLE 7

An aluminum plate having a mechanically roughened surface is whirler-coated with a solution composed of
4.7 p.b.w. of the novolak according to Example 1,
1.4 p.b.w. of compound 6,
0.23 p.b.w. of 2-(acenaphth-5-yl)-4,6-bistrichloromethyl-s-triazine,
0.02 p.b.w. of Crystal Violet base, and
93.65 p.b.w. of butane-2-one,
so that after drying the resulting layer thickness is about 1.5 μm. The layer is imagewise irradiated over all spectral lines by means of an argon-ion laser having a luminous efficiency of 25 W, with the laser being optically focused on a spot of 5 μm diameter. The sensitivity of the layer is sufficient to allow an increase of the writing speed of the laser to over 70 m/s. The exposed layer areas are dissolved within 30 seconds by treating the layer with a 0.32% aqueous soda lye. The trace of the laser may be still further accentuated by dyeing the non-irradiated areas with a greasy ink.

Similar results are obtained if an aluminum plate with an electrolytically roughened and anodized surface is employed as the support. In that case, the required developing time is 1 minute.

EXAMPLE 8

The stability under thermal load of the layers containing the novel acid-cleavable compounds is shown by the following example:

A coating solution according to Example 1, which contains as the acid donor instead of the triazine of Example 1 the same quantity by weight of 2-(6-methoxy-5-methyl-naphth-2-yl)-4,6-bis-trichloromethyl-s-triazine, is applied by whirler-coating to a brushed aluminum foil, in such a way that the dried coating is about 1.5 μm thick.

The material thus obtained is heated for 1 hour to 100° C. in a drying cabinet, it is then exposed for 15 s under the conditions specified in Example 1 and developed within 1.5 minutes by rinsing in the developer of Example 1, so that a positive reproduction of the original results, which is suitable for use as an offset printing form.

EXAMPLE 9

Plates of brushed aluminum are dip-coated in solutions composed of
10.64 p.b.w. of the novolak of Example 1,
3.20 p.b.w. of N-acyliminocarbonate and
0.16 p.b.w. of 2-(4-(2-ethoxy-ethoxy)naphth-1-yl)-4,6-bis-trichloromethyl-s-triazine in
86 p.b.w. of methyl ethyl ketone.

After the plates have been removed from the coating solutions and the solvent has been allowed to evaporate, the plates are dried for 20 seconds in a stream of warm air, and then exposed through a line original which is covered by a 1 mm thick glass plate. The exposing apparatus is equipped with four 40 W fluorescent tubes spaced 4 cm apart. The distance between the tube periphery and the plate surface is about 5 cm. The exposure times required for the various N-acyliminocarbonates are given in Table 5. Development into a positive reproduction of the original is carried out by rinsing in the developer of Example 1.

TABLE 5

| Compound | Exposure Time (seconds) | Compound | Exposure Time (seconds) |
|---|---|---|---|
| 1 | 20 | 16 | 20 |
| 2 | 10 | 17 | 5 |
| 3 | 5 | 18 | 9 |
| 4 | 10 | 19 | 20 |
| 5 | 15 | 20 | 20 |
| 6 | 10 | 21 | 25 |
| 7 | 5 | 22 | 10 |
| 8 | 40 | 23 | 10 |
| 9 | 9 | 24 | 30 |
| 10 | 8 | 25 | 10 |
| 11 | 20 | 26 | 9 |
| 12 | 15 | 27 | 11 |
| 13 | 15 | 28 | 10 |
| 14 | 15 | 29 | 10 |
| 15 | 10 | 30 | 15 |

It will be obvious to those skilled in the art that many modifications may be made within the scope of the present invention without departing from the spirit thereof, and the invention includes all such modifications.

What is claimed is:

1. In a radiation-sensitive mixture containing (a) a compound which forms an acid under the influence of actinic radiation and (b) a compound which has at least one acid-cleavable bond and the solubility of which in a liquid developer is increased by the action of an acid,
the improvement that compound (b) corresponds to the general formula I

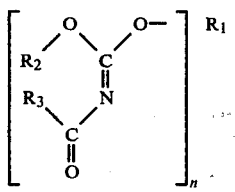

(I)

wherein $R_1$ is an n-valent aliphatic, cycloaliphatic or aromatic group, $R_2$ and $R_3$ are alkyl or aryl groups, and any two of the groups $R_1$, $R_2$, and $R_3$ may be linked to form a heterocyclic ring, and n is an integer from 1 to 3, or to the formula II

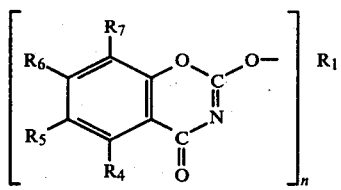

(II)

wherein $R_4$, $R_5$, $R_6$, & $R_7$ are hydrogen atoms or halogen atoms, alkyl, alkoxy, aryl, aryloxy, acyl, acyloxy, carbalkoxy or nitro groups, and any two of the groups $R_4$ to $R_7$ may be linked to form a ring, and $R_1$ and n have the meanings stated above.

2. A radiation-sensitive mixture according to claim 1 in which the compound (b) which is capable of being cleft by an acid corresponds to the formula III

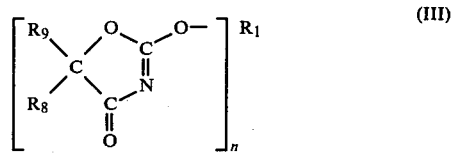

(III)

wherein $R_1$ is an n-valent aromatic group, $R_8$ and $R_9$ are hydrogen atoms or alkyl groups, and n is an integer from 1 to 3.

3. A radiation-sensitive mixture according to claim 1 wherein n is 1 or 2.

4. A radiation-sensitive mixture according to claim 1, wherein $R_1$ is an aromatic group.

5. A radiation-sensitive mixture according to claim 1, wherein one of the groups $R_2$ and $R_3$ carries another grouping of the Formula I as a substituent.

6. A radiation-sensitive mixture according to claim 2, wherein $R_1$ is a substituted or unsubstituted phenyl group, $R_8$ and $R_9$ are methyl groups, and n is 1.

7. A radiation-sensitive mixture according to claim 1, which additionally contains a polymeric water-insoluble binder.

* * * * *